United States Patent [19]

Evans et al.

[11] Patent Number: 5,170,008

[45] Date of Patent: Dec. 8, 1992

[54] EXTERNAL CABLE GROMMET FOR CABLE ENTRY OF EMI PROTECTED CABINETS

[75] Inventors: Robert T. Evans; Richard E. Trogisch; Robert E. Wagner, all of Poughkeepsie, N.Y.

[73] Assignee: International Business Machines Corp., Armonk, N.Y.

[21] Appl. No.: 752,116

[22] Filed: Aug. 29, 1991

[51] Int. Cl.$^5$ .............................................. H05K 9/00
[52] U.S. Cl. ................................. 174/35 C; 174/35 R; 174/65 G; 174/65 R; 439/610
[58] Field of Search ............ 174/35 C, 35 R, DIG. 8, 174/65 R, 65 G; 285/128, 129; 439/610

[56] References Cited

U.S. PATENT DOCUMENTS 4,433,206 2/1984 Lewis .
4,464,540 8/1984 Reeder .
4,468,080 8/1984 Van Brunt .
4,557,545 12/1985 Ohtsuki .
4,577,054 3/1986 de Ronde .
5,012,042 4/1991 Summach .

FOREIGN PATENT DOCUMENTS 2082695 3/1990 Japan .

Primary Examiner—Gerald P. Tolin
Assistant Examiner—Bot Ledinh
Attorney, Agent, or Firm—Floyd A. Gonzalez

[57] ABSTRACT

A grommet provides a surrounding conductive elastomer connection to a stripped portion of an external cable shield. The cable is inserted through the central passage of the grommet and placed in a U-shaped opening in an enclosure frame. The open side of the U is closed with another metal member to complete a 360 degree termination around the shield. A one piece metal band within the grommet provides a direct low resistance path from the cable shield to the enclosure frame. The band has an interference fit in the outer groove of the grommet and utilizes the elasticity of the grommet to hold the band in place.

5 Claims, 1 Drawing Sheet

EXTERNAL CABLE GROMMET FOR CABLE ENTRY OF EMI PROTECTED CABINETS

BACKGROUND OF THE INVENTION

1. Field of the Invention

The present invention relates to electrical cable connections and more particularly to electromagnetic interference (EMI) shielding for cable connectors.

2. Prior Art

In the prior art, various means have been employed to prevent unwanted electromagnetic energy from entering machine cabinets through external electric cables. In the past, jacketed cables with braided shielding have been stripped back from the connector end and the shield terminated to the frame.

The following are examples of prior art patents which describe various mechanisms for attaching an electrical cable shield to a frame to reduce electromagnetic interference. However, it should be noted that none of the prior art patents below teach or suggest the external cable grommet according to the present invention.

U.S. Pat. No. 5,012,042 shows a shielded cable entry device having two body members and a securing nut each of the body members including a semihexagonal flange, semicylindrical shells for making contact with the cable shielding and receiving compressing springs in the threaded section. The device of the patent is relatively complex and requires several more parts than does the simple solution of the present invention.

Japanese Patent 2,082,695 is an example of the prior art discussed above wherein the shield braid is brought back and attached to the frame as a braid strap.

U.S. Pat. No. 4,577,054 shows a coaxial feedthrough consisting of a feedthrough body having a rectangular flange with a threaded coupling through which a coaxial cable is inserted and soldered. On the flange side, the cable is terminated in such a manner that the outer jacket and the dielectric material of the cable are flush with the flange. The cable center conductor protrudes a short distance beyond the flange for the purpose of connecting a ribbon or wire circuit element.

The patent does not teach or suggest the simple but effective device according to the present invention.

U.S. Pat. No. 4,557,545 shows a shielded electrical connector in which the shield cover is formed as two U shaped parts each of which includes an integral clamping portion for clamping with a shielded connector. The clamping portions are connected to the cover parts by leg portions. The clamp portions are clamped about the cable to provide electrical connection between the cable and the shield cover.

The connector of the patent does not suggest the present invention which provides for a completely encircled fully shielded connection as close to the frame as possible.

U.S. Pat. No. 4,468,080 teaches a cable termination means having a metal plate which fits into the open cable receiving end of a connector plug or receptacle, the plate having a number of openings into which one or more hollow metal tubes are received and conductively secured to the plate. One or more insulated cable wires are located within a ground shield, an end portion of which is peeled back preliminarily and connected to an appropriate connector contact. A ring of solder may be used to affix the shield and tube together both mechanically and electrically. Optionally, an aluminum ring may be clamped over the shield by a so-called cryo ring through which an electric current is passed and a further shield connection technique is to employ an oversize ferrule crimped by the use of a suitable tool down on the shield. The mechanism of this patent is much more complex and time consuming to install than is the simple grommet according to the present invention.

U.S. Pat. No. 4,464,540 shows a shield connection device for connecting EMI shielded cable shield to an EMI enclosure, the device including an electrically conductive body defining a shield termination enclosure, the body having a number of openings extending through the body, the openings substantially parallel to the longitudinal axis of the body and the body having means for accessing the opening. A connection device includes means adjacent to the access means for applying electrically conductive material to the opening through the access means for electrically connecting the EMI cable shield thereto.

The mechanism of the shield termination enclosure of the patent is much more complex and time consuming to install than the grommet according to the present invention.

U.S. Pat. No. 4,433,206 shows an EMI shielded connector assembly in which the shield is formed into a pigtail and secured to the shell of the connector assembly, similar to the ground shield braid strap discussed above.

None of the prior art devices described shows a simple low cost solution to the problems of connecting cable shields to a frame for the purpose of reducing electromagnetic interference from flowing into an EMI shielded enclosure.

SUMMARY OF THE INVENTION

Therefore, it is an object of the present invention to connect the braided shielding of a shielded cable to the frame of an EMI shielded enclosure by a grommet formed of a mechanically tough elastomer which includes a symmetrically formed metal low resistance element connecting the shield braid to the enclosure frame.

Accordingly, a grommet provides a surrounding conductive elastomer connection to a stripped portion of an external cable shield. This grommeted cable is inserted into a U shaped frame member with the open side being enclosed with another member to complete a 360 degree termination. A one piece metal band within the grommet provides a direct low resistance path from the cable shield to the enclosure frame. The band has an interference fit in an outer groove of the grommet and utilizes the elasticity of the rubber of the grommet to hold the band in place.

As can be seen from the discussion of the prior art above, the low cost simple grommet with the one piece metal low resistance member within the grommet provides an advantage in cost and effectiveness over the various prior art techniques discussed.

The prior art techniques which employ a length of pigtail of a braid strap for termination of the shield creates a path for inductive spikes.

These and other objects, features and advantages of the present invention will be readily apparent to one skilled in the art from the following detailed description of a preferred embodiment of the invention and related drawing.

DETAILED DESCRIPTION OF A PREFERRED EMBODIMENT OF THE INVENTION

Figure 1:
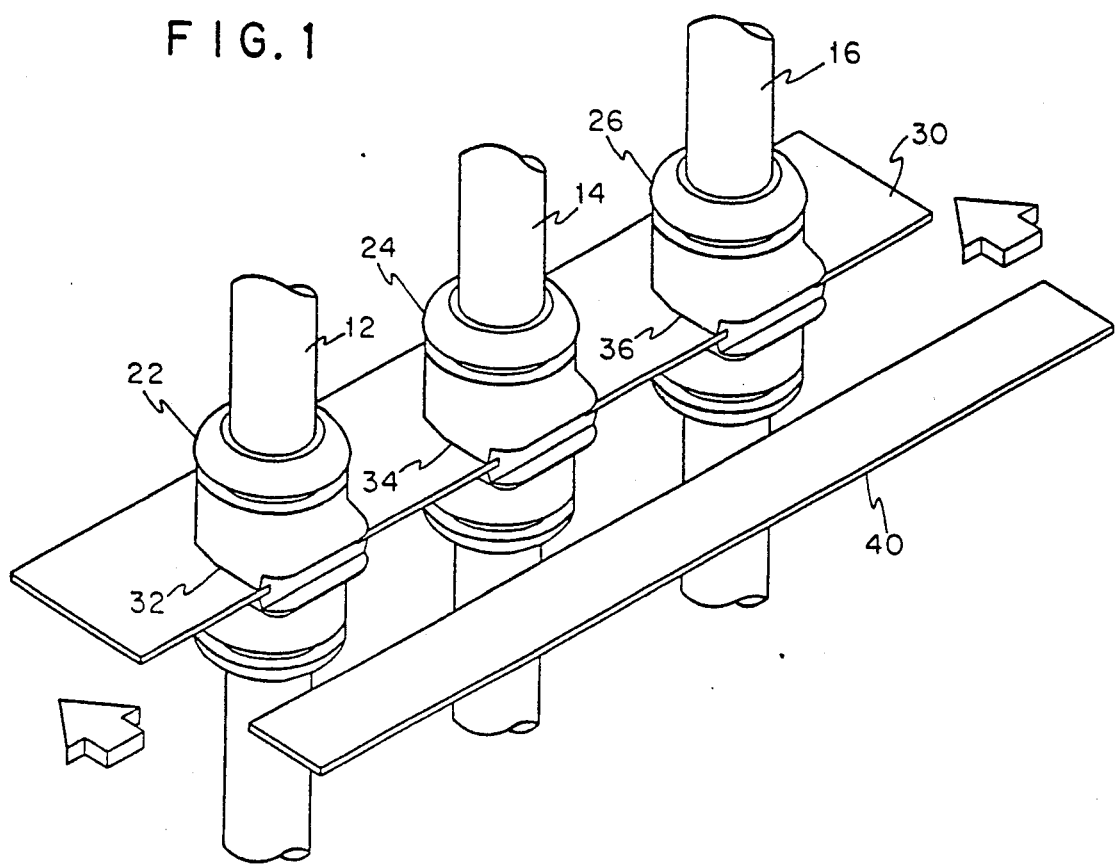
FIG. 1 is a perspective view of the external cable grommets as installed in the frame of a shielded enclosure in accordance with the present invention.

Referring now to FIG. 1, the external cable grommet for cable entry of electromagnetic interference protected enclosures will be described with reference to the preferred embodiment.

Figure 2:
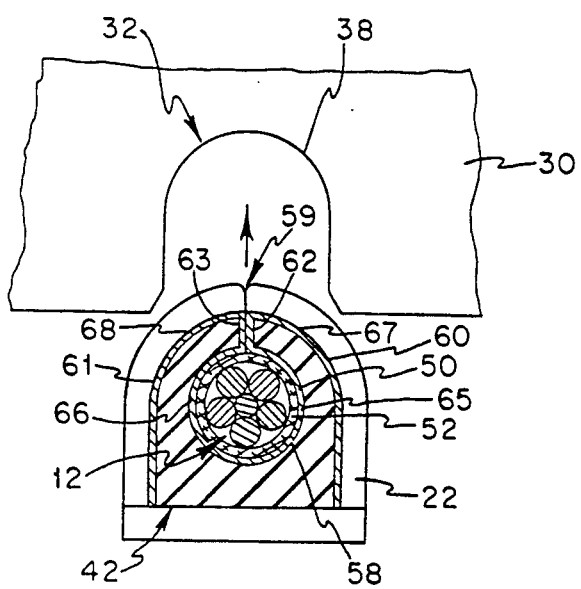
FIG. 2 is a cross section view of the cable grommet in accordance with the present invention.

Three cables 12,14 and 16 pass through respective external cable grommets 22,24 and 26 respectively. A portion of the outer covering of cables 12,14 and 16 is stripped back to permit direct electrical contact between a low resistance conductive member 50 of grommet 22 and conductive shield 52 of cable 12 (see FIG. 2). Frame member 30 has one or more U shaped openings which receive grommets 22,24 and 26 which provide a snug fit of the respective grommets 22,24 and 26 in the U shaped slots 32,34 and 36 respectively in frame member 30 (see FIG. 2 for additional detail). The open end of the U shaped opening 32 etc., is closed by frame member 40 which makes contact with the grommet 22 along the edge 42 thereof (see FIG. 2). The edge 38 of the openings 32,34 and 36 is shaped to fit into a groove in their respective grommets 22,24 and 26 (see FIG. 2) to contact and slightly compress the member 50. It will be understood that instead of terminating at the edge 42 as shown in FIG. 2, the member 50 could be made to extend across the edge 42 to make contact with the frame member 40, if desired. The completed assembly provides a 360 degree conductive contact encircling the shield braid of cables 12 etc. thus providing an effective and low cost EMI shielding at the point of cable entry into the protected frame.

As shown in FIG. 2, the grommet 22 includes a central passage 58 and has a slit 59 communicating with the central passage 58 for allowing the grommet 22 to be spread open along its length for placing the grommet 22 over the shielded cable 12. The grommet 22 includes the mentioned low resistance conductive member 50 has a pair of loops 60 and 61. The bights 62 and 63 of the loops 60 and 61, respectively, are juxtaposed with each other and centered under the slit 59 as shown. The inner walls 65 and 66 of the loops 60 and 61, respectively, form a clamp portion of the member 50 in the center passage 58 such that the inner walls 65 and 66 make electrical contact with the cable shield 52 when the grommet is placed over the cable 12 as shown. The outer walls 67 and 68 of the loops 60 and 61, respectively, make electrical contact with the edge 32 of the U shaped opening 38 in the frame member.

Low resistance conductive member 50 is commonly a metal band which has an interference fit in the outer groove of grommet 22 and is held in electrical as well as mechanical contact with cable shield 52 by the force of the interference fit of the grommet 22 in slot 32.

The elastomeric material of the grommets 22,24 and 26 are made conductive by, for instance, carbon loading. It will be understood that the elastomer may be made conductive by other well known means such as by silver particle loading, etc.

Although the invention has been described with respect to a preferred embodiment thereof, it is clear to those skilled in the art that various modifications and changes may be made in the embodiment without departing from the spirit or scope of the invention.

What is claimed is:

1. A device for reducing electromagnetic interference entering a protected enclosure, comprising:
   a grommet having a central passage therethrough sized for accepting a shielded cable along its length, a slit along the length of said grommet communicating with said central passage for allowing said grommet to be spread open along its length for placing said grommet over said shielded cable, and an external groove communicating with said central passage, said external groove for accepting a portion of said enclosure; and
   a metal band in said central passage, a pair of loops, the bight of each of said loops being juxtaposed with the bight of the other of said loops, said juxtaposed bights being centered under said slit such that when said grommet is spread said juxtaposed bights are separated for allowing the entry of said shielded cable between said bights, the inner walls of said loops defining a central clamp portion aligned with said central passage for clamping around and making electrical contact with a shield of said shielded cable, at least the portion of the outer walls of said loops defining the end walls of said external groove for making electrical contact with a portion of said enclosure when it is in said external channel, for electrically connecting said enclosure to said shield.

2. A device for reducing electromagnetic interference entering a protected enclosure according to Claim 1 wherein said grommet comprises a conductive elastomer material.

3. A device for reducing electromagnetic interference entering a protected enclosure according to claim 1 wherein said external groove is at right angles to said slit.

4. A device for reducing electromagnetic interference entering a protected enclosure according to claim 1 wherein said enclosure opening of generally U shaped to provide a force to hold said metal band in electrical and mechanical contact with said shield.

5. A device for reducing electromagnetic interference entering a protected enclosure according to claim 1 wherein at least the portion of the outer walls of said loops defining the end walls of said external groove for making electrical contact with a portion of said enclosure when it is in said external channel.

* * * * *